United States Patent [19]

Haitz et al.

[11] 3,836,793

[45] Sept. 17, 1974

[54] PHOTON ISOLATOR WITH IMPROVED PHOTODETECTOR TRANSISTOR STAGE

[75] Inventors: Roland H. Haitz, Portola Valley; Paul G. Sedlewicz, Menlo Park; Keith A. Stirrup, Los Altos; David F. Hilbiber, Los Altos Hills; Robert W. Teichner, Palo Alto, all of Calif.

[73] Assignee: Hewlett-Packard Company, Palo Alto, Calif.

[22] Filed: Oct. 19, 1973

[21] Appl. No.: 408,033

Related U.S. Application Data

[63] Continuation of Ser. No. 225,896, Feb. 14, 1972, abandoned.

[52] U.S. Cl. .......... 307/303, 250/211 J, 250/213 A, 307/311, 357/19, 357/29

[51] Int. Cl. .......... H03k 3/26, H03k 3/42

[58] Field of Search .......... 307/303, 311; 250/211 J, 250/213 A; 357/19, 29

[56] References Cited

UNITED STATES PATENTS

| | | | |
|---|---|---|---|
| 3,321,631 | 5/1967 | Biard et al. | 307/311 |
| 3,424,908 | 1/1969 | Sitter | 307/311 |
| 3,462,606 | 8/1969 | Case | 250/213 A |
| 3,524,047 | 8/1970 | Gorder et al. | 307/311 |
| 3,535,532 | 10/1970 | Merryman | 250/211 J |

*Primary Examiner*—Stanley D. Miller, Jr.
*Attorney, Agent, or Firm*—A. C. Smith

[57] ABSTRACT

A photon isolator device wherein the photon emitter and photodetector are matched such that the photodetector and transistor unit can be fabricated utilizing standard integrated circuit monolithic isolation techniques resulting in a high efficiency, high speed photon isolator; one preferred emitter utilizes $GaAs_{(1-x)}P_x$ with x ranging from .20 to .48. A special technique is employed to provide a buried layer under the photodetector region that increases the collection layer depth. The elements in the integrated circuit transistor gain stage are formed so as to provide temperature compensation to balance the temperature dependence of the emitted light of the photon isolator. A novel plastic film insulation is utilized to mount and space the emitter and the photodetector elements of the photon isolator.

4 Claims, 14 Drawing Figures

PHOTON ISOLATOR WITH IMPROVED PHOTODETECTOR TRANSISTOR STAGE

This is a continuation, of application Ser. No. 225,896, filed Feb. 14, 1972, now abandoned.

BACKGROUND OF THE INVENTION

Photon isolators wherein a first electronic circuit is coupled to a second electronic circuit by means of a beam of photons emitted from a semiconductor photon emitter in the first circuit and collected by a semiconductor photon detector in the second circuit are presently in use for a number of applications including isolated switching circuits, pulse transformers, and gate circuits. The most common form of photon isolator utilizes a light emitting diode of gallium arsenide doped with zinc emitting at about 900 nm or gallium arsenide doped with silicon emitting at about 940 nm and a silicon photodiode as the photon detector. In these known devices there is a compromise between speed and current transfer as well as added complexity in providing TTL compatibility.

At these wavelengths, a photodetector of the PN junction type or PIN type requires an active photon collection region with a depth of about 50$\mu$ to obtain the desired collection efficiency, i.e., about 90 percent absorption. Where monolithic structures with gain are desired for cost savings in manufacture, the desired 50$\mu$ depth collection area is maintained for the photodetector in a PN junction device, and the transistor gain stage or stages for the detector is formed by N type emitter deposition in a small area of the P diffusion region of the photodetector, resulting in a large photon detection area and the required gain for the monolithic structure. This monolithic phototransistor structure suffers, however, from a slow response time of the device as a result of the large detector capacitance across the collector-base junction of the gain transistor. This feedback capacitance $C_f$, of the order of 20 pF, results in a large rise time $t_r$ in accordance with the following general relationship:

$$t_r \approx h_{FE} (1/\omega_t + C_f R_c) \ln 9$$

where $h_{FE}$ is the gain of the transistor, $\omega_t$ is the cutoff frequency of the transistor, and $R_c$ is the effective collector resistance as seen from the transistor collector-base junction. From the above relationship, it can be seen that if $C_f$ is very large the latter term dominates and the rise time becomes large. In a typical phototransistor this time is about 10 microseconds. To obtain monolithic isolation between the photodetector and the transistor gain stage, thus substantially reducing $C_f$ to maintain a high speed device, it is necessary to reduce the detection depth of the photodetector to the region of 8–10$\mu$ but this reduces the detection efficiency to about 33 percent at 900 nm and 23 percent at 940 nm. Although a lower detection efficiency is obtained, a larger gain bandwidth product results and the overall result is a somewhat improved isolation circuit.

A fast, TTL compatible isolator may be realized by utilizing a PIN photodetector with the optimum collection region depth to achieve the efficiency and speed, and a saturated IC amplifier with optimized gain stage parameters on an extra chip to achieve speed and TTL compatibility. However, this hybrid approach results in an expensive end product.

Also, monolithic photon isolators suffer from the fact that the emitter is temperature dependent, the light intensity falling off as the temperature increases. Special care must be exercised in the design and fabrication of these types of isolators to reduce the temperature dependence as much as possible to meet specifications over the desired operating temperature range.

The specifications regarding isolation or decoupling of the emitter and photodetector are also stringent, and care must be exercised in the physical mounting of the emitter on the photodetector, with attention to the physical spacing therebetween. Generally, an optically transparent silicone is utilized as a spacer in the fabrication step of mounting the emitter chip on the photodetector chips, and difficulty is encountered both in establishing the needed spacing and in maintaining this spacing until the final encapsulation of the unit.

SUMMARY OF THE INVENTION

In the present invention, a new photon isolator device is provided wherein the photodetector and transistor gain stages are formed monolithically, the photon absorption efficiency in the photodetector being maintained at a high level in a collection depth area compatible with integrated circuit techniques such that the overall figure of merit of the device is significantly better than existing isolator devices including monolithic phototransistor devices.

In the present isolator, a gallium arsenide phosphide light emitter diode is utilized which emits at about 700 nm, this emission wavelength utilizing a photodetector collection layer thickness of about 3–15$\mu$. A collection layer of this depth is compatible with present day integrated circuit monolithic isolation techniques and thus the transistor gain stage or stages may be incorporated in the same integrated circuit structure without encountering large capacitance in the collector-base region of the transistors, thus maintaining a high speed device. A particularly good light emitting diode is produced utilizing $GaAs_{(1-x)}P_x$, where $x$ ranges generally from 0.20 to 0.48, with a preferred value of about 0.30, emitting over a range from 780 to 620 nm.

In a preferred embodiment of this invention, the photon collection efficiency is increased by formation of a special buried layer under the photodetector area at the PN junction, the buried layer in effect increasing the width of the collection layer and thus increasing the photon absorption efficiency. The standard buried layer at the PN junction under the transistor stages is provided in accordance with standard integrated circuit techniques, thus optimizing the transistor performance.

Since the emitter current in these photon isolator devices is temperature dependent, i.e., the emitted light decreases with increasing temperature, the current transfer ratio of the device is temperature dependent. The present invention provides a novel integrated circuit in the transistor gain stage of the photon isolator which compensates for the light decrease with temperature, and provides a temperature independent output for the monolithic integrated circuit device.

A novel plastic coupling assembly is utilized in the present invention to mount the photon emitter onto the photodetector in close spaced-apart relationship while maintaining a high degree of AC and DC isolation between the two devices. In one form of the invention a dielectric spacer comprising a fluorinated ethylenepropylene copolymer film is utilized between the two structures; in another embodiment the spacer comprises a first spacer layer sandwiched between two layers of the above-described film.

DESCRIPTION OF THE DRAWINGS

FIGS. 1(A) and 1(B) are plan views of the face surface of the emitter and the photodetector elements, respectively, while

DESCRIPTION OF THE PREFERRED EMBODIMENTS

Figure 1A:
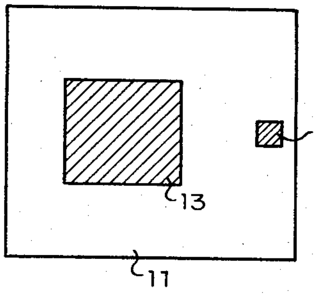
Figure 1B:
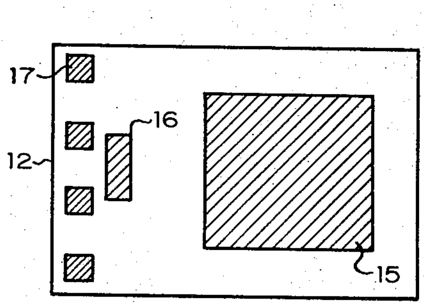
Figure 1C:
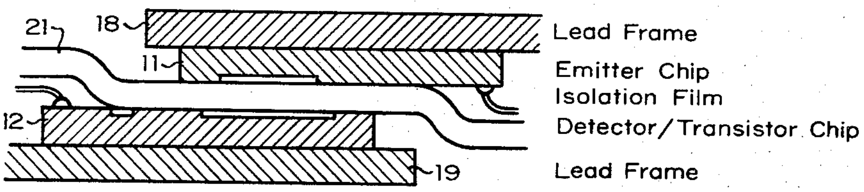
FIG. 1(C) is a cross-sectional view of the photon isolator device incorporating the present invention.

Referring now to FIGS. 1(A) through 1(C), there is shown a typical form of photon isolator including the photon emitter wafer 11 shown in FIG. 1(A), the photodetector and transistor gain stage wafer 12 shown in FIG. 1(B), and the emitter 11 and photodetector stage 12 shown assembled together in FIG. 1(C). The emitter element comprises a wafer having an emitter area 13 formed therein which, in prior art devices, generally comprises gallium arsenide doped with zinc emitting at about 900 nm or gallium arsenide doped with silicon emitting at about 940 nm, and a bonding pad 14 for creating an electrical connection with the emitter. The photon detector structure comprises a semiconductor chip with a photodetector area 15 formed therein as well as a transistor 16 serving as a gain stage for the photodetector and bonding areas 17 for making external connections with the output of the photodetector-transistor circuit. In the typical assembly shown in FIG. 1(C), the emitter chip 11 is bonded to a first lead frame 18, the photodetector-transistor chip 12 is bonded to a second lead frame 19, and the emitter unit 11 is assembled on the photodetector unit 12 with the emitter area 13 in alignment with the photodetector area 15 and with a suitable optically transparent electrical isolation film 21 positioned between the emitter and detector to electrically isolate and properly space one from the other.

Figure 2A:
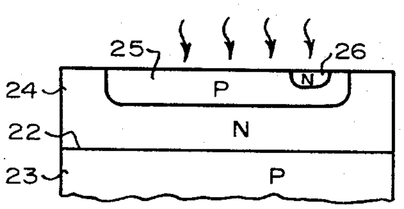
PRIOR ART Figure 2A
FIGS. 2(A) and 2(B) are a cross-sectional view through a wafer incorporating a photodetector and transistor and an equivalent circuit therefor, respectively, of a known type of phototransistor device.

Referring now to FIG. 2(A), there is shown in cross-sectional view a typical form of known phototransistor utilized as the photodetector stage in a photon isolator unit which has very good gain but low speed. In order that the photodetector operate at a satisfactory efficiency when utilized with the typical gallium arsenide infrared emitters operating in the range of 900–940 nm, the PN junction 22 between the P type substrate 23 and the N type epitaxial layer 24 must provide a long penetration depth for the infrared radiation in the silicon, for example 45$\mu$ and 70$\mu$ for 90 percent absorption of 900 and 940 nm, respectively. The requirement of such a large photon collection depth militates against forming the transistor on the same chip since isolation rings may not be formed to separate the transistor from the photodetector. In these known forms of phototransistors, the transistor typically is formed in the P diffusion region 25 of the photodetector area as illustrated by the emitter deposition 26.

Figure 2B:
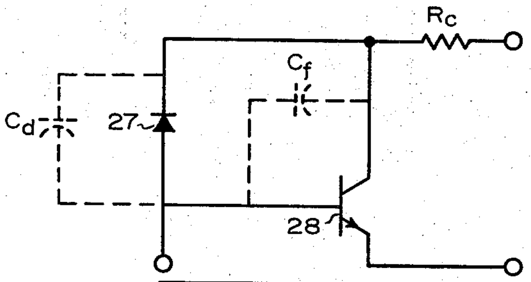

The schematic diagram of this form of structure is shown in FIG. 2(B). Since the transistor and photodetector are not isolated from each other the large detector capacitance $C_d$ across the photodiode 27 appears across the collector-base junction of the transistor 28, forming a large portion of the feedback capacitance $C_f + C_d$ and resulting in a slow response time for the transistor, e.g., 10 microseconds for a collector resistance $R_c$ of 1 kΩ. By decreasing the depth of the PN junction so that it is compatible with isolation techniques in IC fabrication such that the transistor can be isolated from the photodetector, the speed of the device can be greatly increased, but the efficiency of the photodetector decreases substantially. The overall gain bandwidth of the device may, however, be improved.

Figure 3:
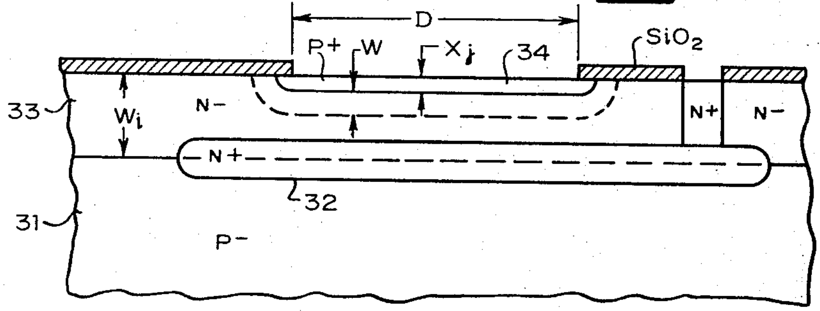
FIG. 3 is a cross-sectional view through a photodetector diode section of an isolator structure of a general form utilized to describe the operation of the present invention.

It is desired to provide a photon isolator with optimized characteristics, and reference is made to FIG. 3 for a discussion of the photodetector construction.

To be IC compatible the photodetector is preferably designed in relatively low resistivity material ($\rho \leq 5.0$ Ωcm N-type), and a suitable device comprises a P substrate 31 with a bured N+ layer 32 and an N epitaxial layer 33 of thickness $W_t$ and donor concentration $N_d$. A planar P+ diffusion 34 of depth $x_j$ and diameter D forms a PN junction. The width of the space charge layer at an operating voltage of 5 V is denoted by W and it does not reach the N+ buried layer 32. Since the P+ diffusion is extremely shallow ($x_j \approx 0.5\mu$), the fact that the space charge layer sweeps back 0.1–0.2 into the P+ layer is neglected. Under these assumptions the switching time of the detector, $t_{det}$, can be written as:

$$t_{det} \approx W/v_d + (W_t - x_j - W)^2/D_p.$$

The first term denotes the transit time of carriers with a drift velocity $v_d$ through the space charge layer. The second term denotes the diffusion time of holes from the undepleted N-layer to the space charge layer. Hole diffusion from the N-layer around the periphery is neglected. For both terms the maximum values are used, e.g., full transit time through W and full diffusion time from the N+ concentration peak in the buried layer. For a detector made by a shallow P+ diffusion into 5.0Ωcm N type material, W = 2.4$\mu$ at 5 V. With $x_j$ = 0.5$\mu$, $W_t$ = 5$\mu$, $D_p = 10^2$ cm/sec and $v_d = 10^7$ cm/sec, then $t_{det} = 1.7 \times 10^{-11}$ sec + $4.4 \times 10^{-9}$ sec. The detector switching time (for both rise and fall) is, therefore, of the order of 5 nsec. and very fast for the desired functions. It is noted that $t_{det}$ is dominated by the diffusion term and it can be shortened by decreasing the width of undepleted material; however, a reduction in this width ($W_i - x_j - W$) will reduce the photocurrent $I_p$.

Because the photocurrent $I_p$ is a dominant factor in determining the amplifier switching time, the trade-offs of photocurrent and detector speed are to be considered. To determine $I_p$, the following assumptions are made:

1. All photons absorbed within the P+ layer of thickness $x_j$ contribute to $I_p$ since the acceptor concentration gradient between surface and $x_j$ leads to an electric field accelerating photoelectrons toward $x_j$.
2. All photons absorbed within the space charge layer W contribute to $I_p$.
3. All photons absorbed within the undepleted layer ($W_i - x_j - W$) also contribute to $I_p$ because the recombination time for holes in this layer is much longer than the diffusion time across it. It is noted that the concentration gradient between the N− and N+ layer results in an electric field preventing holes from diffusing from the N− layer into the P− substrate. Hence, all holes generated by photons eventually end up at the P+ layer and thus contribute to $I_p$.
4. All photons absorbed within the lower half of the buried layer and within the P− substrate will not contribute to $I_p$.
5. Edge effects are neglected.

From the above assumptions it follows that all photons absorbed within the N− epitaxial layer of thickness $W_i$ contribute to $I_p$. Photons absorbed in the substrate or outside the actual detector area will not contribute to $I_p$.

With the above assumptions, the following relation for the photocurrent is obtained:

$$I_p = (qH/h\nu)\, A \int_0^{W_i} \alpha_{Si} e^{-\alpha_{Si} x} dx$$

where H is the irradiance in W/cm$^2$, $q$ is the electron charge, $h\nu$ is the quantum energy of photons, A is the detector area $\pi D^2/4$, and $\alpha_{Si}$ is the absorption coefficient in the detector material. In the limit of a thin detector ($W_i << 1/\alpha_{Si}$); this simplifies to:

$$I_p = (qH/h\nu)\, A\, (1 - e^{-\alpha_{Si} W_i}) \approx (qH/h\nu)\, A \alpha_{Si} W_i$$

and thus for the case of a thin detector limit, $I_p$ increases directly with the $\alpha_{Si} W_i$ product.

Turning now to the transistor stage of the device, the turn on time of a transistor has two components, the delay time $t_d$ and the rise time $t_r$ such that:

$$t_{on} = t_d + t_r$$

The charge control theory of switching transistors leads to the following expression for $t_d$:

$$t_d = (C_{in}/I_p)\, \Delta V_{EB}$$

where $C_{in}$ denotes the effective input capacitance of the transistor including the photodiode capacitance and the voltage change $\Delta V_{EB}$ denotes the voltage required to forward bias the emitter-base junction from its dark current level $I_{Co}$ to the current $I_C$ under illumination. Therefore:

$$t_d = (C_{in}/I_p)\, (kT/q)\, \ln\, (I_C/I_{Co}).$$

Since $I_C$ and $I_{Co}$ can differ by many orders of magntiude $\Delta V_{EB}$ is expected to be in the 200–500 mV range. The delay time is directly proportional to the effective input capacitance and inversely proportional to the photocurrent delivered by the detector. Low $C_{in}$ and large $I_p$ are required to obtain short delay times.

The rise time is usually approximated by the following expression:

$$t_r \approx h_{FE}\, (1/\omega_T + C_f R_c)\, \ln 9$$

where $h_{FE}$ denotes the common emitter current gain, $\omega_T = 2\pi f_T$ with $f_T$ denoting the gain-bandwidth product, $C_f$ is the collector-base feedback capacitance, and $R_c$ is the effective collector resistance as seen from the collector-base junction.

The turn-off time $t_{off}$ also consists of two terms $$t_{off} = t_s + t_f$$

where $t_s$ is the storage time and $t_f$ is the fall time of the transistor. For the case of a linear amplifier, the transistor is not driven into saturation and $t_s$ is not existent. The fall time $t_f$ is approximately the same as the rise time $t_r$.

In summary it can be said that low capacitance (detector, collector-base and emitter-base) and high photocurrents are required to maximize switching speed of both a phototransistor and a detector-amplifier combination.

Referring now to the emitter element, the speed considerations discussed above show that the delay time $t_d$ decreases inversely with photocurrent $I_p$ and, therefore, with the external efficiency of the emitter. The rise and fall time $t_r$ and $t_f$ are indirectly effected by the emitter efficiency. To achieve a given current transfer ratio $I_{out}/I_{in}$ it is possible to compensate low photocurrents $I_p$ by an increased transistor gain $h_{FE}$. However, as noted above $t_r$ and $t_f$ are directly proportional to $h_{FE}$ and high $h_{FE}$ values are, therefore, undesirable. Since it is desired that the detector be compatible with IC technology, the epitaxial layer width should be below 15$\mu$.

Figure 4:
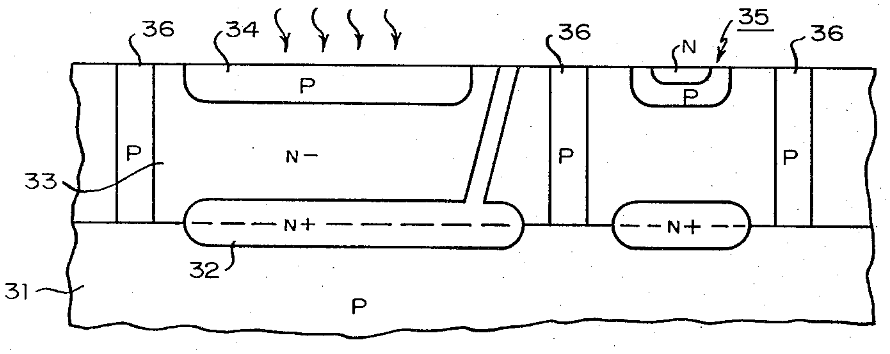
FIG. 4 is a cross-sectional view through the photodetector and transistor gain stage of a structure incorporating the present invention.

The following table summarizes a performance analysis using various light emitting materials for the emitter and using a photodetector with an effective collection depth of $W_c = 8\mu$. The photodiode drives a monolithically integrated transistor 35 (see FIG. 4) whose collector is electrically isolated from the cathode of the photodiode by ring isolator areas 36, thus separating the large diode capacitance $C_d$ from the critical collector-base feedback capacitance $C_f$. A conventional isolator using a phototransistor as the detector and gain element is also included in the comparison.

| EMITTER MATERIAL | $\lambda$ nm | $\eta_e$% | $\alpha$ cm$^{-1}$ | $\tau_e$ nsec. | $\eta_e(1-e^{-\alpha W_d})$% | $h_{FE}$ | $\tau$ nsec. | F kHz |
|---|---|---|---|---|---|---|---|---|
| GaAs:Zn | 900 | 0.8 | 500 | 100 | 0.27 | 150 | 300 | 470 |
| GaAs:Si | 940 | 1.5 | 340 | 500 | 0.35 | 120 | 550 | 250 |
| GaP:ZnO | 700 | 1.0 | 2150 | 500 | 0.82 | 50 | 510 | 270 |

| EMITTER MATERIAL | λ nm | $\eta_e$% | α $cm^{-1}$ | $\tau_e$ nsec. | $\eta_e(1-e^{-\alpha W_d})$% | $h_{FE}$ | τ nsec. | F kHz |
|---|---|---|---|---|---|---|---|---|
| $GaAs_{(1-x)}P_x$ (x=.40) | 655 | 0.1 | 3000 | 5 | 0.09 | 440 | 810 | 170 |
| $GaAs_{(1-x)}P_x$ (x=.30) | 700 | 0.5 | 2150 | 25 | 0.41 | 100 | 180 | 780 |
| GaAs:Zn (Phototrans.) | 900 | 0.8 | 500 | 100 | 0.5 | 80 | 3700 | 40 |

In this table, λ denotes the wavelength at the emission peak, $\eta_e$ the external efficiency into plastic material with an index of refraction n = 1.5, α the absorption coefficient in silicon at the emission peak, and $\tau_e$ the optical rise time of the emitter. The product $\eta_e$ [1−exp (−$\alpha W_c$) ] represents the amount of light absorbed within the detector assuming that all light emitted through the top surface of the emitter enters the photodetector. The transistor gain $h_{FE}$ is allowed to vary to bring the current transfer ratio CTR = $h_{FE}$ $\eta_e$[1−exp (−$\alpha W_c$)] to an arbitrarily chosen value of 40 percent. The isolator response time τ is calculated from the following equation:

$$\tau^2 = \tau_e^2 + [2.2\ h_{FE}\ (1/\omega_t + R_C\ C_f)]^2$$

with the first term denoting the emitter response and the second term the transistor response. The rise time of the photodiode is small compared with either of the above terms. To compute τ, the following values are used: $f_t = \omega_t/2\pi$ = 500 MHz, $R_C$ = 1kΩ and $C_f$ = 0.5 pF. An isolator figure of merit F is also computed and given by gain times bandwidth in a circuit with a 1 kΩ load. It is noted that the highest F values are not obtained with the most efficient materials such as GaAs:Si or GaP:ZnO, but rather with an optimized composition of GaAs emitting at 700 nm. It is also noted that the figure of merit for conventional isolators using GaAs:Zn emitters and phototransistors is 20 times lower compared with a GaAsP based isolator. It is therefore most desirable to utilize an emitter of $GaAs_{(1-x)}P_x$ where x is in the range of 0.20 to 0.48, and preferably about 0.30.

In an isolator constructed utilizing a $GaAs_{.70}P_{.30}$ emitter, IC isolation techniques in the detector-transistor element results in a reduction in $C_f$ to values well below 1pF. Good emitter-detector alignment techniques result in a reduction in the emitter and detector dimensions, giving better emitter efficiency and lower parasitic capacitances. The trade-off between current transfer and speed is optimized, making the isolator compatible with TTL interfaces without additional amplification. The important parameters are summarized in the following table:

| PARAMETER | NEW HIGH SPEED ISOLATOR | CONVENTIONAL PHOTO-TRANSISTOR ISOLATOR |
|---|---|---|
| Current Transfer Ratio ($I_{in}$ = 16 mA) | 15% | 35% |
| Bandwidth ($R_C$ = 1 kΩ) | 5 MHz | 40 kHz |
| Rise/Fall Time ($R_C$ = 1 kΩ) | 150 nsec. | 9 μsec. |
| Delay Time | 90 nsec. | 3 μsec. |
| Storage Time ($h_{FE}$ forced to half, unclamped Saturation Voltage | 200 nsec. | 0.5 μsec. |

light has an absorption coefficient compatible with a 3–6μ epitaxial silicon layer 33 in the detector chip. These N-type epitaxial silicon layers 33 are grown on the P-type sub-strate 31 to create an isolated N region for the various IC devices on the chip. There is also provided an N+ buried layer under each device between the P-type substrate 31 and the N-type epitaxial layer 33, this buried layer reducing the device resistance and, in the optical photodetector, defining the maximum collection distance for the impinging photons. Although the 3–6μ epitaxial layer is optimum for the various devices on the chip, such as the transistors and the resistors, it is preferred that the collection depth for the photodetector be wider, for example, on the order of 9– 10μ.

A novel technique is utilized in this photon isolator for modifying the buried N-type layer 32 under the photodiode region relative to the buried layers 32′ under the remainder of the IC device to thereby increase the photon collection in the photodetector area. The distance that photons are collected (assuming absorption length similar to epitaxial layer thickness) will be either to the maximum of the buried layer or to a shorter distance where the lifetime is shorter than the drift time. Thus, this new photodetector structure utilizes a buried layer 32 that is of a lower concentration (N-type) than the standard buried layer 32′ and also diffuses this modified buried layer 32 more deeply into the P-type substrate 31 than the standard buried layer. This modified buried layer gives an increased minority carrier lifetime and moves the maximum buried layer concentration to a depth greater than the depth of the interface of the epitaxial layer and the P-type substrate.

In one photon detector fabricated in accordance with the present invention, the maximum concentration depth under the transistors and resistors of the IC devices is at a standard buried layer depth of about 6μ whereas the maximum concentration in the photodetector region is at a depth of about 9μ, both in an epitaxial layer structure where the interface of the epitaxial layer 33 with the P-type substrate 31 is at a depth of about 6μ.

Figure 5:
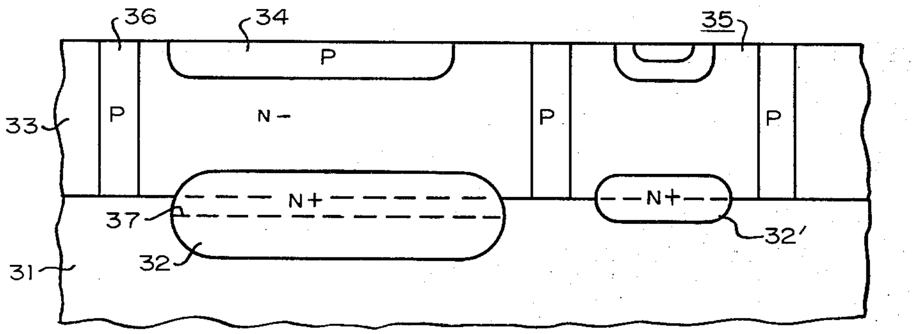
FIG. 5 is a longitudinal cross-sectional view through another photodetector and transistor stage of the present isolator device disclosing another embodiment of the present invention.

Referring now to FIG. 5, a novel technique is employed in the present photodetector to increase the photon collection in the photodetector area while maintaining the standard IC fabrication techniques throughout the remainder of the silicon chip. In utilization of the present $GaAs_{(1-x)}P_x$, the 700 nm emitted In the fabrication of this IC structure, the standard P-type substrate 31 is first oxidized and thereafter, by standard masking techniques, a window is opened for deposition of the photodiode buried layer 32. This is produced by depositing Sb with a sheet resistance of about 450 ohms per square and then driving this deposition into the P substrate 31 in an oxidized atmosphere at about 1,200°C for about 15 hours. Thereafter, the other windows are opened for the transistor buried layer 32' wherein Sb is deposited with a sheet resistance of about 20 ohms per square followed by the standard oxidizing technique for a standard buried layer IC. Thereafter, the normal epitaxial layer 33 is grown on the substrate 31 and the photodetector, transistor and other devices formed on the wafer by standard IC techniques. By following this manufacturing technique, the buried layer in the photon detector area has a lower N type concentration and a longer effective depth relative to the concentration and depth under the remainder of the IC devices on the chip.

Figure 6:
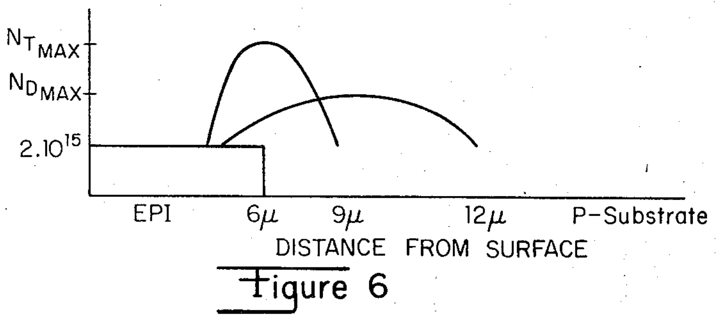
FIG. 6 is a graph showing the effect of the buried layer structure of the device shown in FIG. 5.

A graph which plots the concentration vs. distance of the effective P substrate from the surface is shown in FIG. 6, where the depth of the epitaxial layer 33 is $6\mu$ and the maximum concentration of the transistor elements, $N_t$ of about $10^{20}$, is located at this depth. The maximum concentration in the detector area, $N_d$ of about $10^{19}$, is lower than the concentration in the transistor regions and occurs at a depth 37 of about $9\mu$. Thus, this technique permits an optimization of the photodetector region and the transistor regions on a monolithic IC device.

In another embodiment of the invention, the same N+ concentration is utilized under both the photodetector and transistor regions. The layer is first formed in the photodetector region and driven in hard, after which the layer is formed in the transistor region as described above. The deep drive of the photodetector buried layer reduces the concentration somewhat relative to the transistor layer, e.g., 5 to 8 × $10^{19}$ as compared with the transistor region layer of $10^{20}$, and provides the deeper depth in the photodetector region.

The internal quantum efficiency of a photodetector operating at 900 nm with a standard buried layer throughout the IC circuit is approximately 21–22 percent. At the same light wavelength, the efficiency is about 29 percent when the modified buried layer technique is utilized in the photon detector region. When the light emitter utilized is $GaAs_{(1-x)}P_x$ with a frequency of about 700 nm, the efficiency with a standard buried layer in both transistor and photodetector region is about 74 percent, this efficiency being increased to about 86 percent when the modified buried layer is employed under the photon detector area of the IC device. Thus it can be seen that a substantial improvement in efficiency is obtained when the gallium arsenide phosphide emitter is utilized and the photodetector employs the novel modified buried layer technique of the present invention.

The present photon isolator structure may be so constructed that it provides a transfer characteristic essentially independent of temperature and in addition provides a clearly defined threshold level to minimize noise sensitivity. Prior types of high speed isolators exhibit a negative temperature coefficient (TC) with a variation of nearly 3:1 over the military specification range of −55°C to +125°C. A partial compensation of this temperature dependence has been provided by coupling the detector output to the base of a bipolar transistor such that the positive TC of current gain tends to offset the negative TC of the output of the light emitter. This known method reduces switching speeds by about two orders of magnitude. Further an overcompensation is observed for temperatures below ambient, while an undercompensation follows for temperatures above ambient.

Figure 8:
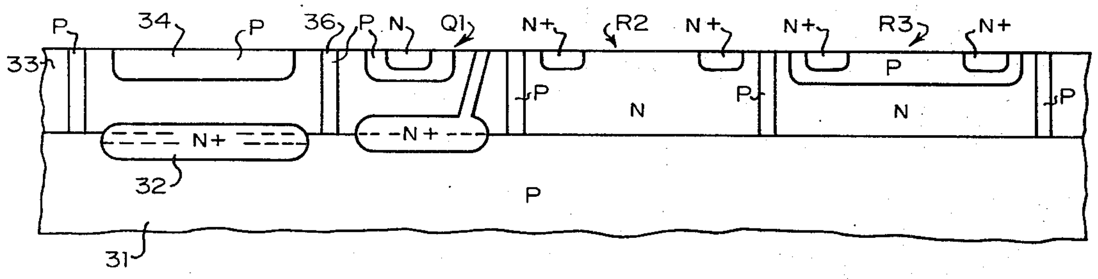
FIG. 8 is a longitudinal cross-sectional view of the photon detector and transistor gain stage of the novel photon isolator structure illustrated in FIG. 7.
Figure 7:
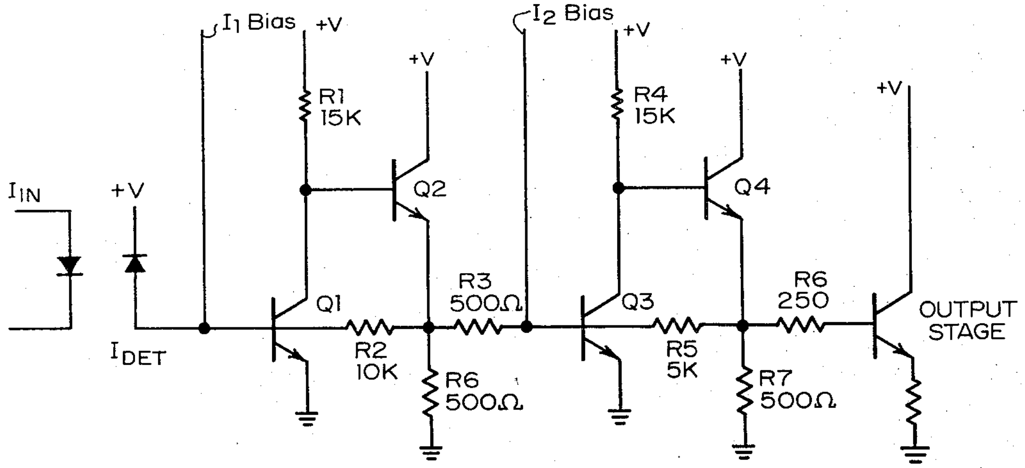
FIG. 7 is a schematic diagram of a photon isolator device illustrating a novel form of integrated circuit in the photodetector gain stage for providing a temperature compensated photon isolator.

Referring now to FIGS. 7 and 8, there is shown a novel isolator amplifier structure that provides current transfer efficiencies greater than unity while maintaining high data transfer rates. Transistors Q1 and Q2 form a feedback doublet characterized by a very good gain bandwidth (GBW) and stability of gain and GBW with temperature. The biasing currents $I_{bias(1)}$ and $I_{bias(2)}$ are generated by means well known in the monolithic art such that $I_{bias(1)}$ is nominally identical to $I_{C1}/h_{FE1}$. Hence, the output voltage at the emitter of Q2 is essentially $V_{BE1}$ less the drop due to the detector current through R2. The stage comprising Q3 and Q4 operates in a similar manner. The equivalent input current is determined by the difference of the voltage between the emitter of Q2 and the base voltage of Q3, acting through R3.

It has been found that the TC of resistance of the collector epitaxial film is positive, approximately 0.7 percent per degree C around ambient. Hence, if the resistor R2 is synthesized from the epitaxial film as illustrated in FIG. 8, a partial correction is afforded for the negative TC of the current from the detector. By forming resistor R3 from a standard base diffusion process wherein the TC of resistance is approximately 0.2 percent per degree C around ambient while the resistor R5 is an eptiaxial film resistor, an additional positive gain-coefficient of about 0.5 percent per degree C is obtained. Thus, the transfer from the current to the light emitter ($I_{IN}$) to the voltage at the emitter of Q4 is almost ideally compensated. This output voltage may be converted to a proportional output current by suitable means such as Q5 and R6.

A threshold for the circuit is afforded by scaling the current densities of Q1 and Q3. It is assumed that the Q1 and Q3 are adjacent on a chip (and isothermal). For example, if the emitter current density of Q1 is double that of Q3, the base-voltage of Q3 is lower than the base-voltage of Q1 by about 18 mv at 300°K. Hence, a quiescent current (when $I_{IN}$=0 ) will flow into the base of Q3 causing the voltage at the base of Q5 to approach zero. When the detector current flowing through R2 causes a drop in excess of 18 mv, the voltage at the emitter of Q4 will exceed $V_{BE5}$ and an output current will flow that is essentially proportional to $I_{IN}$.

Figure 9:
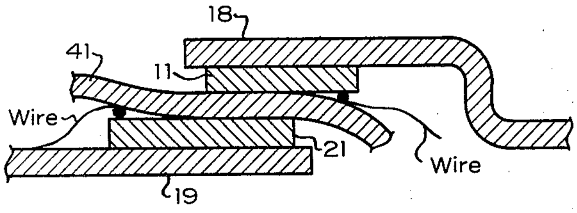
FIGS. 9, 10, and 11 are longitudinal cross-sectional views of three forms of photon isolator assemblies illustrating the novel isolation film utilized between the emitter and photon detector elements of the device.
Figure 10:
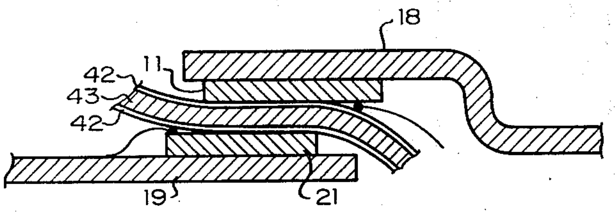
Figure 11:
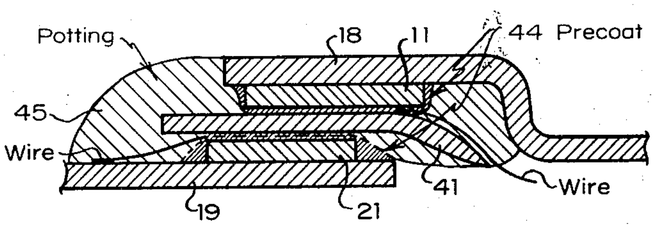

A novel form of dielectric spacer is utilized with the photon coupled isolator of the present invention as seen in FIGS. 9 and 10, this novel isolator providing higher voltage isolation between the emitter and detector with a narrower isolation gap therebetween, thus improving the coupling. The dielectric spacer in one embodiment is a fluorinated ethylenepropylene copolymer, such as the DuPont Teflon FEP, a dielectric film 41 with a dielectric strength of about 5,000 V/mil. This compares with the formerly used silicone materials with a dielectric strength of about 500 V/mil and thus the spacing between the optically coupled elements may be reduced to approximately one-tenth of the distance when using the film of this invention as compared with the prior silicone films. This results in a substantially increased coupling between the emitter 11 and the photodetector 21 since most of the emitted light cone is subtended by the detecting element. This in turn permits the use of a smaller photodetector chip resulting in an increased device speed.

In one particular embodiment of this film isolator, a 2 mil thick film is positioned between the coupling elements and the device is heated to a temperature in the range of 250°–300°C for about 1 minute. This results in a softening of the film 41 and causes it to bond to the emitter and detector chips 11 and 12, with a resultant elimination of air spaces or voids in the sandwich structure.

In another embodiment of the dielectric film isolation technique the FEP film 42 is laminated in a sandwich manner to an inner Kapton (polymide) film 43 about 1 mil thick. This laminated film is then used at approximately 280°C between the emitter and detector dice. The Kapton 43, which does not soften at this temperature, serves as a shim to maintain a minimum fixed spacing between the emitter surface and the detector surface while affording a good optical transparency to the 700 nm light.

It is noted that in addition to providing a close coupling and high isolation, the novel film also provides a bond between the emitter and detector chips sufficient to produce an integral unit during manufacture and until final encapsulation of the device can be accomplished.

In a further embodiment, the emitter and detector chips 11 and 21 are precoated with a thin (<1 mil thick) layer 44 of a soft optically clear silicone resin. The film 41 of FEP, which may be 1 mil thick, is placed between the precoated coupling elements but not fused or bonded. The air which may be trapped in the layers is voided by then potting the assembly with more silicone 45.

The important parameters of the FEP film in this application are a dielectric strength at 60 Hz and 1 mil thick of 5,000 volts per mil at 25°C and 3,000 volts per mil at 150°C, a dielectric constant of about 2.1 at 25°C and 1 Hz, a refractive index of about 1.34, and a percent transmission at 700 nm of about 94 percent.

It should be understood that the conductivity of the various layers given as P and N in the illustrative embodiments may be changed in accordance with standard well known semiconductor techniques without departing from the scope of this invention.

We claim:

1. A monolithic semiconductor structure comprising a layer of a first conductivity type on a substrate of a second conductivity type, a photodetector region including a diffusion area of said second conductivity type in said layer, first and second amplifier stages, each including a first transistor formed in said layer comprising a base, collector, and emitter, a second transistor formed in said layer comprising a base, collector, and emitter, the base of said second transistor being coupled to the collector of said first transistor, and a first resistor coupling the emitter of said second transistor to the base of said first transistor, a second resistor coupling the emitter of said second transistor in said first amplifier stage to the base of said first transistor in said second stage, said first resistor in said two amplifier stages comprising regions of said layer, said second resistor comprising a diffusion region of a second conductivity type in said layer, circuit means coupling the photodetector to the base of said first transistor, means for coupling a source of bias current to the base of said first transistors in said two amplifier stages, and an output circuit coupled to the emitter of said second transistor in said second stage.

2. A structure as claimed in claim 1 wherein said first conductivity type is N type and said second conductivity type is P type.

3. A semiconductor structure as claimed in claim 1 wherein said layer is 15$\mu$ or less thick, and a light emitting diode for transmitting light to said photodetector region in the order of 680–740 nm.

4. A semiconductor structure as claimed in claim 3 wherein said emitting diode is made of $GaAs_{1-x}P_x$, where $x$ lies in the range of 0.20 to 0.48.

* * * * *

UNITED STATES PATENT OFFICE
CERTIFICATE OF CORRECTION

Patent No. 3,836,793 Dated September 17, 1974

Inventor(s) Roland H. Haitz, et al.

It is certified that error appears in the above-identified patent and that said Letters Patent are hereby corrected as shown below:

Column 6, in the heading of the 6th column of the Table following line 63, cancel "$^{W}d$" and substitute -- $^{W}c$ --.

Column 7, in the heading of the 6th column of the Table as continued, cancel "$^{W}d$" and substitute -- $^{W}c$ --.

Column 7, the Table following line 51 is incomplete. Please add the following lines below "Saturation Voltage":

| | | |
|---|---|---|
| ($I_C$ = 2 mA) | 0.10 V | 0.25 V |
| Input/Output Isolation Voltage | > 6 kV | > 1.5 kV |

Signed and sealed this 24th day of December 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334